United States Patent [19]
Dijkmans

[11] Patent Number: 5,587,678
[45] Date of Patent: Dec. 24, 1996

[54] INTEGRATED CIRCUIT HAVING AN OUTPUT STAGE WITH A MILLER CAPACITOR

[75] Inventor: Eise C. Dijkmans, Eindhoven, Netherlands

[73] Assignee: U.S. Philips Corporation, New York, N.Y.

[21] Appl. No.: 437,750

[22] Filed: May 9, 1995

[30] Foreign Application Priority Data

May 9, 1994 [EP] European Pat. Off. ............ 94201298

[51] Int. Cl.⁶ ........................... H03F 3/26; H03K 19/003
[52] U.S. Cl. ..................... 327/108; 327/170; 327/111; 327/365; 327/376; 327/377; 327/379; 327/380; 326/26; 326/27
[58] Field of Search ........................ 327/111, 108, 327/535, 379, 380, 381, 382, 170, 112, 427, 365; 326/86, 82, 26, 27, 33, 21

[56] References Cited

U.S. PATENT DOCUMENTS 4,857,863  8/1989  Ganger et al. ............ 327/108
5,051,625  9/1991  Ikeda et al. ............... 326/86

Primary Examiner—Timothy P. Callahan
Assistant Examiner—Dinh T. Le
Attorney, Agent, or Firm—Steven R. Biren

[57] ABSTRACT

An integrated circuit, includes an output stage with an input which is coupled to a first and a second gate of an NMOS transistor and a PMOS transistor, respectively, and an output which is connected to a first and a second supply terminal via the PMOS transistor and the NMOS transistor, respectively. The output is coupled to the first gate via a series connection of a Miller capacitor and a switching circuit. The Miller capacitor limits the rate of increase of the voltage on the output, thus preventing interference. The switching circuit is rendered non-conductive ahead of the switching over from logic low to logic high. This prevents sudden discharging of the Miller capacitor which would otherwise cause interference itself.

7 Claims, 2 Drawing Sheets

INTEGRATED CIRCUIT HAVING AN OUTPUT STAGE WITH A MILLER CAPACITOR

BACKGROUND OF THE INVENTION

The invention relates to an integrated circuit, comprising an output stage with an input which is coupled to a first and a second gate electrode of a first and a second current channel, respectively, and an output which is connected to a first and a second supply terminal via the first and the second current channel, respectively, which output stage is arranged to switch over, under the control of a signal on the input, from a first state (L) in which the first and the second current channel are conductive and non-conductive, respectively, to a second state (H) in which the first and the second current channel are non-conductive and conductive, respectively, the output being coupled to the first gate electrode via a series connection of a Miller capacitor and switching means. An integrated circuit of this kind is known from U.S. Pat. No. 5,051,625.

The first current channel in this circuit is formed by the channel of an NMOS transistor; the second current channel is the channel of a PMOS transistor. In the first state, i.e. the "logic low" state, the channel of the NMOS transistor connects the output to the low supply voltage applied to the first supply terminal. In the second state, i.e. the "logic high" state, the channel of the PMOS transistor connects the output to the high supply voltage applied to the second supply terminal. To this end, the voltage on the gate electrodes of the NMOS transistor and the PMOS transistor is logic low.

Upon switching over from the second to the first state, the voltage on the gate electrodes is raised from logic low to logic high. The voltage on the output then decreases because the channel of the NMOS transistor starts to conduct whereas the channel of the PMOS transistor ceases to conduct. If switching over from the second to the first state is very fast, disturbances occur. The speed of switching over, and hence the occurrence of disturbances, is dependent on the degree of loading of the output.

The Miller capacitor provides retrocoupling of the voltage on the output to the gate electrode of the NMOS transistor. Such retrocoupling opposes the increase of the voltage on the gate electrode of the NMOS transistor. This opposition is greater as the rate of decrease of the voltage on the output is higher. Because the rate of decrease of the voltage on the output itself is dependent on the voltage on the gate electrode of the NMOS transistor, due to the characteristic of the NMOS transistor, the rate of decrease is thus limited. The Miller capacitor thus controls the rate of decrease and limits the disturbances occurring upon switching over from the second to the first state.

Upon switching over from the first to the second state, the channel of the PMOS transistor starts to conduct whereas the channel of the NMOS transistor ceases to conduct. The rate at which the channel of the NMOS transistor ceases to conduct is then slowed down by the Miller capacitor, whereas the PMOS is already conductive. As a result, a short-circuit current starts to flow from the first to the second supply terminal. This current causes interference pulses on the supply terminals and increases the power consumption of the circuit.

In an embodiment of the prior art circuit the channel of a further NMOS transistor is connected in series with the channel of the NMOS transistor. In response to the signal on the input, the channel of the further transistor is also rendered non-conductive when the channel of the NMOS transistor is rendered non-conductive.

This prevents the short-circuit current, although this is not disclosed in the cited publication (U.S. Pat. No. 5,051,625), but has the drawback that a substantial surface area in the integrated circuit is thus taken up. As it forms part of the current path of the output stage, the further NMOS transistor already has to be constructed so as to be rather large. Moreover, the NMOS transistor and the further NMOS transistor must be twice as large as the NMOS transistor in the original output stage if the output stage is to retain the same drive power as the original output stage comprising a single NMOS transistor.

SUMMARY OF THE INVENTION

It is inter alia an object of the invention to provide an integrated circuit which comprises an output stage with a Miller capacitor for limiting the switching speed and in which the short-circuit current remains limited without a substantial amount of additional surface area being required. The integrated circuit in accordance with the invention is characterized in that it comprises a facility for rendering the switching means non-conductive ahead of the switching over from the first state (L) to the second state (H). As a result of the uncoupling of the Miller capacitor from the gate electrode of the first current channel, the first current channel can be rendered non-conductive more quickly, thus preventing the short-circuit current.

It is to be noted that switching means arranged between the output and the first gate electrode are known per se from the cited U.S. patent (U.S. Pat. No. 5,051,625). In addition to the first and the second state, the circuit according to the cited publication also has a high impedance state in which neither the NMOS transistor nor the PMOS transistor is conductive. To this end, the circuit comprises a special enable input which is independent of the signal input and which serves to realize the high impedance state.

The switching means in the circuit according to the cited publication are provided to prevent coupling through of the signal from the input to the output via the Miller capacitor in the high impedance state. To this end, the switching means are controlled via the enable input. Outside the high impedance state, notably upon switching over from the first state to the second state and vice versa, the switching means according to the cited publication remain conductive. Moreover, the first and the second gate electrode are directly interconnected, so that the first and second gate electrodes cannot be independently controlled either.

For the switching over from the second to the first state the switching means are rendered conductive again. Thus, for this switching over the Miller capacitor has the described effect of limiting the rate of decrease of the voltage on the output.

An embodiment of the integrated circuit in accordance with the invention is characterized in that it comprises a discharging circuit for discharging the Miller capacitor after the switching means have been rendered non-conductive. The discharging circuit adjusts the voltage across the Miller capacitor to the value required for the next switching over from the second to the first state.

The rate at which the Miller capacitor is charged to the appropriate voltage defines the maximum frequency at which changes of state may succeed one another. If the change-overs were to succeed one another so quickly that after a change-over the voltage across the Miller capacitor has not yet reached the correct value for the next change-over, the first and the second current channel would be simultaneously conductive, thus causing a disturbing current pulse between the supply terminals. The rate at which the Miller capacitor is charged to the appropriate voltage, however, may not be too high as otherwise the current required to charge the Miller capacitor itself would cause a disturbing current pulse on the supply terminals. A suitable compromise is to make the rate of charging of the Miller capacitor substantially equal to the rate of change of the output voltage.

An embodiment of the integrated circuit in accordance with the invention is characterized in that the discharging circuit comprises a third current channel which is of the same conductivity type as the first current channel, that the Miller capacitor is coupled to the first gate electrode via successively a junction and the switching means, that the junction is coupled to the first gate electrode via the third current channel, and that a third gate electrode of the third current channel is coupled to the output. In this embodiment discharging takes place via the third current channel whose conductivity gradually increases at a rate which is dependent on the rate of change of the voltage on the output. The discharging rate will thus be adapted to the rate of change of the output signal. Therefore, discharging will not be unnecessarily fast so that it does not cause an unnecessary current pulse on the supply terminal.

An embodiment of the integrated circuit in accordance with the invention is characterized in that the output is coupled to the second gate electrode via a further series connection of a further Miller capacitor and further switching means, and that it comprises a further facility for rendering the further switching means non-conductive ahead of the switching over from the second state (H) to the first state (L). The rate of change of the voltage on the output is thus controlled also for the switching over from the first to the second state, without the switching over from the second to the first state giving rise to an unnecessary short-circuit current.

An embodiment of the integrated circuit in accordance with the invention is characterized in that the Miller capacitor is coupled to the first gate electrode via the switching means and to the second gate electrode via further switching means, and that the integrated circuit comprises a further facility for rendering the further switching means nonconductive ahead of the switching over from the second to the first state. One Miller capacitor thus serves for the switching over from the first to the second state as well as for the switching over from the second to the first state, without giving rise to unnecessary short-circuit currents. The surface area for a second Miller capacitor is thus saved. A condition to be satisfied in this respect is, of course, that such switching over operations should not succeed one another so quickly that the Miller capacitor has not yet been fully charged or discharged upon switching over.

An embodiment of the integrated circuit in accordance with the invention is characterized in that the input is coupled to a third and a fourth gate electrode of a third and a fourth current channel, respectively, and that the first electrode is coupled, via the third current channel and via a series connection of a resistor and the fourth current channel, to the first and the second supply terminal, respectively. Upon switching over from the second to the first state, the Miller capacitor is charged via the resistor and the fourth current channel and the voltage on the first gate electrode, therefore, will change gradually. Upon switching over from the first to the second state, the voltage on the first gate electrode will change due to a current through the third current channel. In accordance with the invention the switching means are not conductive for the latter switching over, so that the third current channel need not discharge the Miller capacitor. Consequently, the change of the voltage on the first control electrode is fast, nevertheless without giving rise to a large current pulse.

The invention can be used notably in output stages intended to control output pins of the integrated circuit whereto a load which is not exactly known in advance is to be connected.

BRIEF DESCRIPTION OF THE DRAWING

The invention and its advantages will be described in detail hereinafter with reference to the drawing; in which.

DESCRIPTION OF THE PREFERRED EMBODIMENTS

Figure 1:
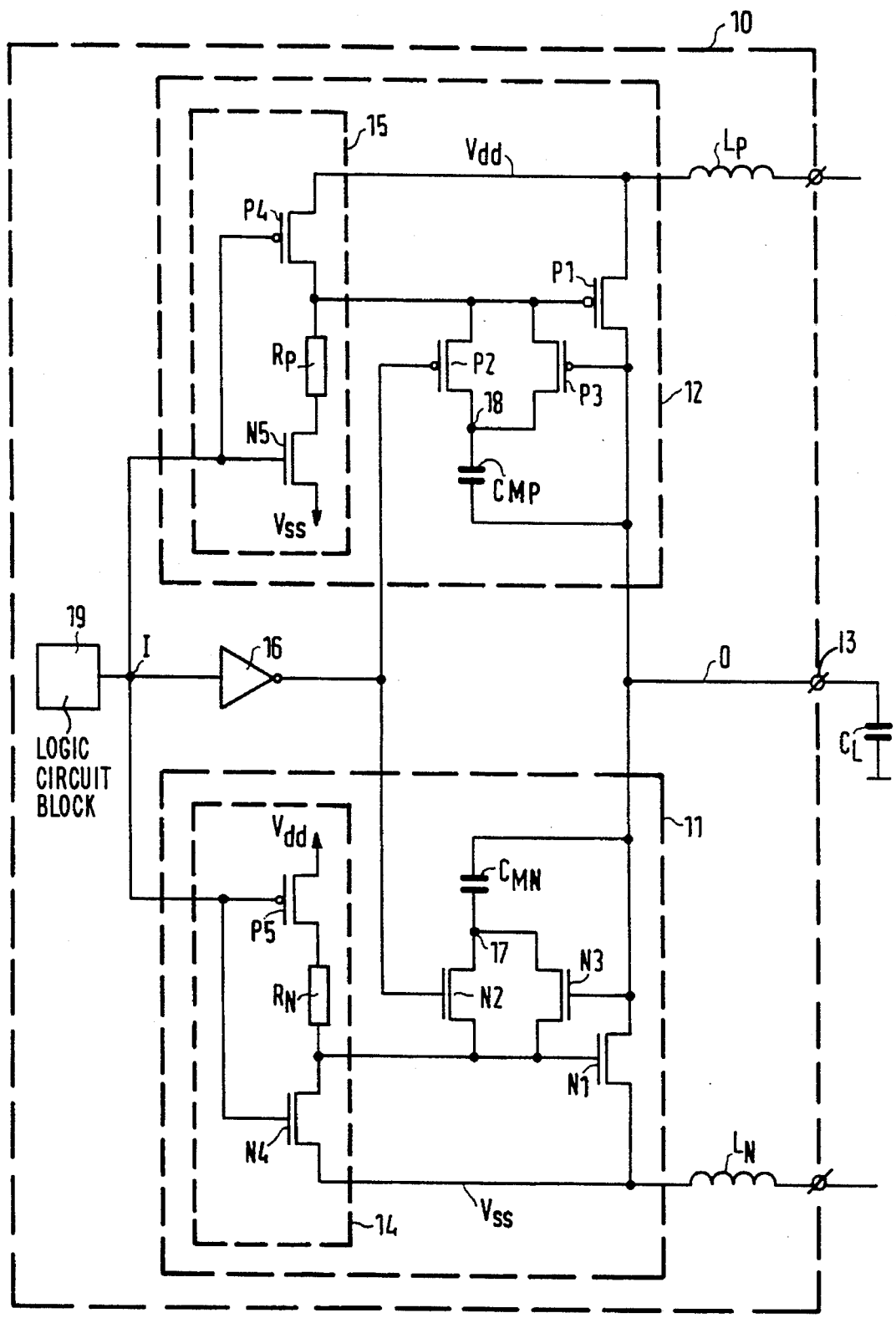
FIG. 1 shows an embodiment of a part of an integrated circuit in accordance with the invention.

FIG. 1 shows an embodiment of a part of an integrated circuit 10 in accordance with the invention. It shows a logic circuit block 19, having an output coupled to an input I of an output stage with an output O. Between the input I and the output O there is arranged a parallel connection of an N-part 11 and a P-part 12, together constituting an output stage. The output O is coupled to a pin 13 of the integrated circuit 10. An external load capacitance $C_L$ is coupled to the pin 13 of the integrated circuit 10. The first and the second supply terminal (Vss, Vdd) of the integrated circuit are coupled to further pins of the integrated circuit via wires. These wires are symbolized by inductances $L_p$, $L_N$.

The input I of the N-part 11 is coupled to the input of a first input inverter 14. The output of the first input inverter 14 is coupled to a first gate electrode. This gate electrode serves to control the conductivity in a current channel which, in conjunction with the gate electrode, is conventionally indicated as a transistor. The transistor comprising the first electrode is referred to as the first output transistor N1. The current channel of the first output transistor N1 is connected between the output O and the first supply terminal Vss. The output O is coupled to a terminal of a Miller capacitor $C_{NN}$, the other terminal of which is coupled, via the current channel of an NMOS feedback transistor N2, to the first gate electrode. The input I is coupled to the gate electrode of the NMOS feedback transistor N2 via an inverter 16. The junction 17 of the Miller capacitor $C_{MN}$ and the current channel of the NMOS feedback transistor N2 is coupled to the first gate electrode via the current channel of an NMOS discharge transistor N3. The gate electrode of the NMOS discharge transistor N3 is coupled to the output O.

The P-section 12 is identical to the N-section, except that the NMOS transistors N1, N2, N3 and the first input inverter 14 are replaced by PMOS transistors P1, P2, P3 and a second input inverter 15, respectively; the first supply terminal Vss and the second supply terminal Vdd are interchanged. The Miller capacitor in the P-section 12 is referred to as $C_{MP}$ and the output transistor P1 is referred to as the second output transistor.

In the first input inverter 14 in the N-section 11 the first and the second - supply terminal (Vss, Vdd) are connected via successively the current channel of an NMOS transistor N4, a resistor $R_N$ and the current channel of a PMOS transistor P5. The input of the first input inverter 15 is coupled to the gate electrodes of the transistors N4, P5. A junction of the resistor $R_N$ and the current channel of the NMOS transistor N4 is coupled to the output of the first input inverter 14. The P-section comprises a second input inverter 15 (P4, $R_p$, N5) which is complementary to the first input inverter 14. During operation the first input inverter 14 acts as a conventional inverter, but the current that it can output from the second supply terminal Vdd is limited due to the resistor $R_p$.

During operation the output O of the circuit can assume one of two logic states, as shown in FIG. 1, under the control of the logic circuit block 19 which generates signals on the input I. In the first state (output logic low) the voltage on the input I is logic low and the current channel of the output transistor N1 in the N-section 11 is conductive, whereas the current channel of the output transistor P1 in the P-section 12 is not conductive. In this state the Miller capacitor $C_{MN}$ in the N-section 11 is conductively connected, via the current channel of the feedback transistor N2, to the gate electrode of the NMOS output transistor N1. Across the Miller capacitor $C_{M1}$ in the N-section 11 a voltage arises which corresponds to the voltage difference between logic high and low as present on the gate electrode of the NMOS output transistor N2 and the output 0, respectively. The Miller capacitor $C_{MP}$ in the P-section 12 is isolated from the gate electrode of the second output transistor P2. The current channel of the discharge transistor N3 in the N-section 11 is not conductive; that of the discharge transistor P3 in the P-section 12 is conductive. Across the Miller capacitor $C_{MP}$ in the P-section 12 a voltage arises which corresponds to the voltage difference between logic high and low as present on the gate electrode of the PMOS output transistor P2 and the output O, respectively.

When the voltage on the input is made logic high, the circuit will switch over from the first to the second state (logic high). Under the control of the input, first the feedback transistor N2 is rendered non-conductive, via the inverter 16, so that the Miller capacitor $C_{MN}$ in the N-section 11 is isolated from the gate electrode of the NMOS output transistor N1.

Subsequently, via the output of the first input inverter 14 the first gate electrode of the output transistor N1 is pulled to the voltage on the first supply terminal Vss, so that the first output transistor N1 is rendered non-conductive. Because the current channel of the feedback transistor N2 isolates, it is not necessary to discharge the Miller capacitor, so that the first gate electrode of the first output transistor N1 can be pulled down quickly and without causing an unnecessary current pulse due to discharging of the Miller capacitor $C_{MN}$. Because the voltage on the output O initially is still logic low, the current channel of the discharge transistor N2 isolates so that the charge across the Miller capacitor $C_{MN}$ in the N-section 11 is initially retained.

Upon said switching over to logic high, the current channel of the feedback transistor P2 in the P-section 12 is rendered conductive under the influence of the input. Moreover, initially the current channel of the discharge transistor P3 remains conductive under the influence of the output O. Thus, the second gate electrode is also connected to the output O via the current channel of the transistors P2 and P3 and the Miller capacitor $C_{MP}$.

Upon said switching over to logic high, the second input inverter 15 starts to pull down the voltage on its output. The second input inverter 15, however, is capable of delivering a limited current only. This current charges the Miller capacitor $C_{MP}$ and the gate capacitance of the second output transistor P2. As a result, the current channel of the second output transistor P1 starts to conduct. Consequently, the load capacitance $C_L$ is charged and the voltage on the output O increases. The rate of increase is codependent on the magnitude of the load capacitance. As the voltage on the output O increases faster, however, the Miller capacitor $C_{MP}$ will tend to push up the voltage on the second gate electrode again, thus slowing down the rising of the voltage on the output O.

As the voltage on the output O increases, the current channel of the discharge capacitor N3 in the N-section 11 will gradually start to conduct. Consequently, the voltage across the Miller capacitor $C_{MN}$ in the N-section 11 will ultimately correspond to the difference between the logic high and the logic low voltage as present on the output O and the gate electrode of the NMOS output transistor N1, respectively.

Switching over from the second to the first state takes place in approximately the same way as the switching over from the first to the second state, although the roles of the N-section 11 and the P-section 12 are interchanged.

The currents required for switching over are derived via the supply terminals Vdd, Vss. These terminals are connected to the pins of the integrated circuit via connection wires. The connection wires behave as inductances and, therefore, are represented by coils $L_n$ and $L_P$ in FIG. 1. Variations in the current through these wires, as occurring upon switching over, cause interference pulses. The invention mitigates these interference pulses because the rate of change of the signal on the output is limited and because unnecessarily fast discharging of the Miller capacitors $C_{MN}$, $C_{MP}$ is prevented by rendering the feedback transistors P2, N2 non-conductive before the output transistor N1, P1, to the gate electrode of which they are coupled, is rendered non-conductive.

Upon switching over from the second to the first state, the feedback transistor N2 in the N-section 11 is rendered conductive. If the full voltage difference between the output O and the gate electrode of the NMOS input transistor N1 were not yet present across the Miller capacitor $C_{MN}$ in the N-section 11 at that instant, there would be a risk of the output transistor N1 becoming directly conductive at the beginning of switching over, when the NMOS transistor N4 closes, so that the current drawn by the output stage would quickly increase and hence a high induction voltage could arise across the inductance L. Therefore, the switching frequency of the signal on the output I is preferably kept so low that the Miller capacitor is allowed to reach its full voltage.

The optimum discharging speed for the Miller capacitors $C_{MN}$ and $C_{MP}$ is, therefore, determined by a compromise. Excessively fast discharging causes unnecessary current pulses. Excessively slow discharging reduces the maximum usable frequency of the signal on the input I.

In order to realize this compromise, use can in principle also be made of resistors, or components acting as resistors, instead of the current channel of the discharge transistors N3, P3. The resistances are then chosen so that the discharge rate of the Miller capacitors $C_{MN}$, $C_{MP}$ is limited thereby to such an extent that discharging does not cause disturbing interference pulses (instead of to the gate electrode of the output transistors N1, P1, these resistances can also be connected directly to the supply terminals $V_{DD}$, $V_{SS}$, in the P-section 12 and the N-section 11).

The solution shown in FIG. 1, utilizing discharge transistors N3, P3 whose gate electrodes are coupled to the output O, however, is more attractive. This is because the discharge rate is then adapted to the rate of charging of the output O. As a result, the discharge transistors N3, P3 can be proportioned so that the discharge current pulses through the Miller capacitors $C_{MN}$ and $C_{MP}$ and the discharge transistors N3, P3 are not more disturbing than the current pulses through the current channels of the output transistors N1, P1, the discharge rate nevertheless fast if the variation of the voltage on the output O is fast (and notably increases strongly as the voltage on the output O increases strongly, so that a large amount of charge would be dissipated in the case of direct conduction) and hence a high frequency is feasible for the signals used.

Figure 2:
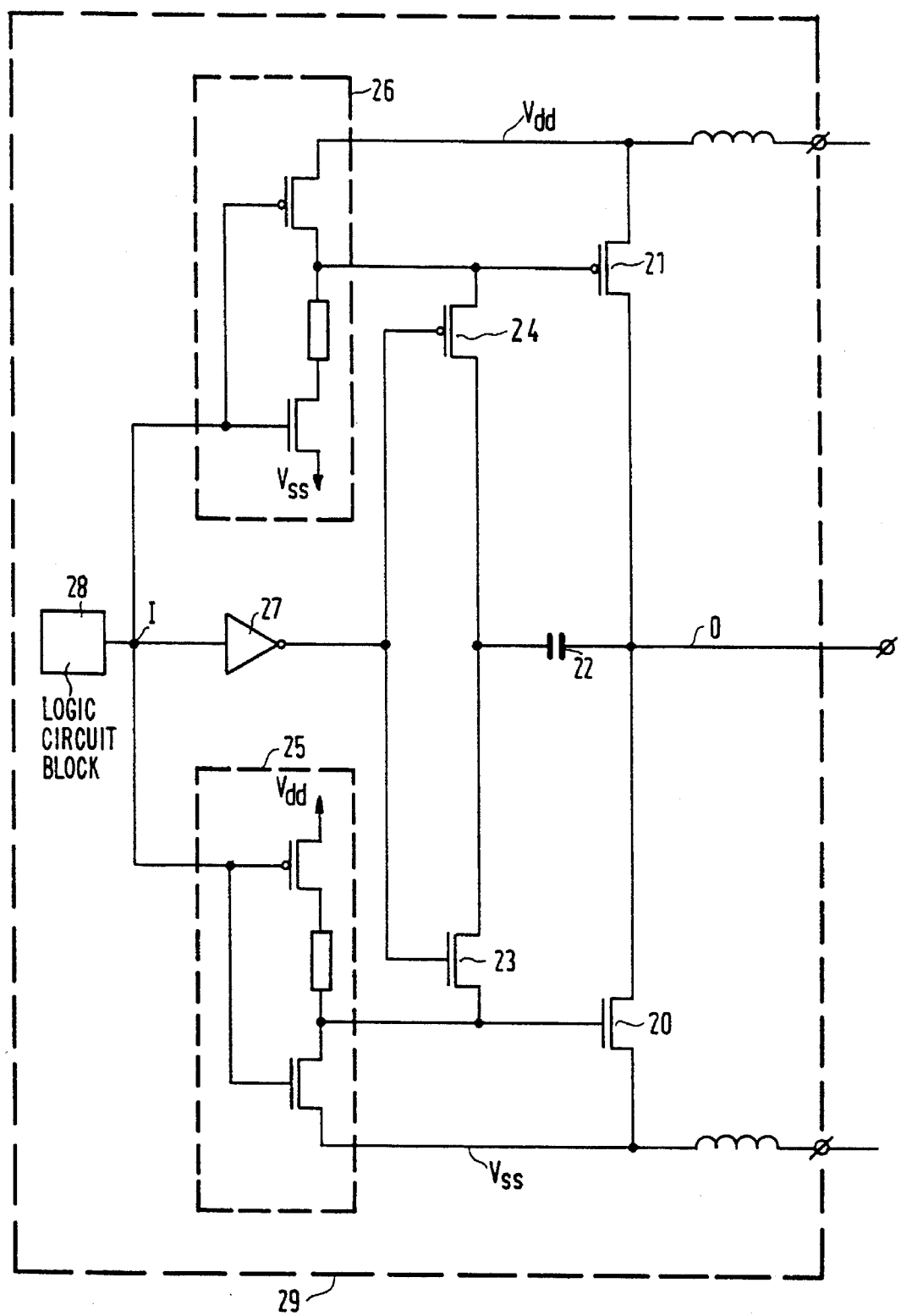
FIG. 2 shows a further embodiment of a part of an integrated circuit in accordance with the invention.

FIG. 2 shows a further embodiment of a part of an integrated circuit 29 in accordance with the invention. In this embodiment a logic circuit block 28 is coupled to an input I which is coupled, via a first input inverter 25, to a first gate electrode of a first output transistor 20 of the NMOS type. The current channel of the first transistor 20 is connected between the first supply terminal Vss and the output O. The first input inverter 25 has the same structure as the first input inverter 14 described with reference to FIG. 1.

The input I is also coupled, via a second input inverter 26, to a second gate electrode of a second output transistor 21 of the PMOS type. The current channel of the second output transistor 21 is connected between the second supply terminal Vss and the output O. The second input inverter 26 has the same structure as the second input inverter 15 described with reference to FIG. 1.

The output O is fed back to the first gate electrode via a Miller capacitor 22 and the current channel of an NMOS feedback transistor 23. Furthermore, the output O is fed back to the second gate electrode via this capacitor and the current channel of a PMOS feedback transistor 24. Via an inverter 27, the input I is coupled to the gate electrodes of the PMOS feedback transistor 24 and the NMOS feedback transistor 24.

During operation the logic circuit block 28 can set the output O to each of two logic states. In the first state (output logic low) the voltage on the input I is logic low and the current channel of the first output transistor 20 is conductive, whereas the current channel of the second output transistor 21 is not conductive. In this state the Miller capacitor 22 is conductively connected to the first gate electrode of the first output transistor 21) via the current channel of the feedback transistor 23. The Miller capacitor 22 is isolated from the gate electrode of the second output transistor 21.

Upon switching over from the first to the second state (logic high), the voltage on the input I becomes logic high. Under the control of the input I, first the Miller capacitor 22 is isolated from the gate electrode of the first output transistor 20 by rendering the feedback transistor 23 non-conductive.

Via the output of the first input inverter 25, subsequently the first gate electrode of the first output transistor 20 is pulled to the voltage on the first supply terminal Vss, so that the first output transistor 20 becomes non-conductive. Because the current channel of the feedback transistor 23 isolates, it is then unnecessary to discharge also the Miller capacitor, so that the first gate electrode of the first output transistor 20 can be pulled down quickly and without giving rise to an unnecessary current pulse for the discharging of the Miller capacitor 22.

Upon said switching over to logic high, the current channel of the feedback transistor 24 is rendered conductive, under the influence of the input, via the inverter 27. Thus, the second gate electrode is connected to the output O via the current channel of the feedback transistor 24 and the Miller capacitor 22. The second input inverter 26 pulls down the voltage on its output. The second input inverter 26 is capable of delivering a limited current only. This current charges the Miller capacitor 22 and the gate capacitance of the second output transistor 21. Consequently, the current channel of the second output transistor 21 becomes conductive. As a result, the voltage on the output O increases. The rate of increase is also dependent on the magnitude of the load capacitance. As the voltage rise on the output O is taster, however, the Miller capacitor 22 will push up the voltage on the second gate electrode, so that the rising of the voltage on the output O is slowed down.

Switching over from the second to :the first, state is quite similar to the switching over from the first to the second state, although the roles of the first supply terminal Vss, the inverter 25, the first output transistor 20 and the feedback transistor 23 are exchanged with those of the second supply terminal Vdd, the inverter 26, the second output transistor 21 and the feedback transistor 24, respectively.

The Miller capacitor 22 alternately performs the same slow-down task for the first and the second output transistor 20, 21 upon switching over from the first to the second state and over from the second to the first state, respectively.

In comparison with the embodiment shown in FIG. 1, the embodiment of FIG. 2 reduces the current pulses on the connection wires of the integrated circuit because unnecessary discharging of the Miller capacitor 22 is prevented. However, this is at the expense of an inevitable reduction of the maximum usable frequency of transitions in the output signal. This is because these transitions should succeed one another with a spacing such that upon a transition the Miller capacitor has been charged or discharged to such an extent that the output transistor whereto it is coupled in first instance remains non-conductive. Interference pulses due to simultaneous conduction of the output transistors are thus prevented.

I claim:

1. An integrated circuit, comprising an output stage with an input which is coupled to a first and a second control electrode of a first and a second output stage current channel, respectively, and an output which is connected to a first and a second supply terminal via the first and the second current channel, respectively, said output stage switching over, under the control of a signal on the input, from a first state (L) in which the first and the second current channel are conductive and non-conductive, respectively, to a second state (H) in which the first and the second current channel are non-conductive and conductive, respectively, the output being coupled to the first control electrode via a series connection of a Miller capacitor and switching means, said integrated circuit being characterized in that it comprises means for rendering the switching means non-conductive ahead of the switching over from the first state (L) to the second state (H).

2. An integrated circuit as claimed in claim 1, characterized in that it comprises a discharging circuit coupled to the Miller capacitor for discharging the Miller capacitor after the switching means has been rendered non-conductive.

3. An integrated circuit as claimed in claim 2, characterized in that the discharging circuit comprises a third current channel which is of the same conductivity type as the first current channel, that the Miller capacitor is coupled to the first control electrode via successively a junction and the switching means, that the junction is coupled to the first control electrode via the third current channel, and that a third control electrode of the third current channel is coupled to the output.

4. An integrated circuit as claimed in claim 1, characterized in that the output is coupled to the second control electrode via a further series connection of a further Miller capacitor and further switching means, and that it comprises a further means for rendering the further switching means non-conductive ahead of the switching over from the second state (H) to the first state (L).

5. An integrated circuit as claimed in claim 1, characterized in that the Miller capacitor is coupled to the first control electrode via the switching means and to the second control electrode via further switching means, and that the integrated circuit comprises a further means for rendering the further switching means non-conductive ahead of the switching over from the second to the first state.

6. An integrated circuit as claimed in claim 1, characterized in that the input is coupled to a third and a fourth gate electrode of a third and a fourth current channel, respectively, and that the first electrode is coupled, via the third current channel and via a series connection of a resistor and the fourth current channel, to the first and the second supply terminal, respectively.

7. An integrated circuit as claimed in claim 1, characterized in that the output is coupled directly to an output pin of the integrated circuit.

* * * * *